United States Patent [19]

Kamasz et al.

[11] Patent Number: 5,650,352
[45] Date of Patent: Jul. 22, 1997

[54] METHOD OF MAKING CCD READOUT REGISTER HAVING MULTIPLE OUTPUTS

[75] Inventors: Stacy Royce Kamasz, Waterloo, Canada; Michael George Farrier, Boyne City, Mich.

[73] Assignee: Dalsa, Inc., Canada

[21] Appl. No.: 544,068

[22] Filed: Oct. 17, 1995

Related U.S. Application Data

[62] Division of Ser. No. 321,267, Oct. 11, 1994, Pat. No. 5,608,242.

[51] Int. Cl.⁶ .................................................. H01L 21/339
[52] U.S. Cl. ............................ 437/53; 437/50; 437/203
[58] Field of Search ........................... 437/26, 50, 53, 437/203; 148/DIG. 50

[56] References Cited

U.S. PATENT DOCUMENTS

| | | | |
|---|---|---|---|
| 4,087,832 | 5/1978 | Jambotkar | 437/53 |
| 4,210,922 | 7/1980 | Shannon | 257/220 |
| 4,246,591 | 1/1981 | Kosonocky et al. | 257/222 |
| 4,658,278 | 4/1987 | Elabd et al. | 257/222 |
| 4,665,420 | 5/1987 | Kosonocky et al. | 257/229 |
| 4,667,213 | 5/1987 | Kosonocky | 257/219 |
| 4,698,656 | 10/1987 | Kamata | 257/221 |
| 4,809,048 | 2/1989 | Kimata et al. | 257/219 |
| 4,812,887 | 3/1989 | Boudewijns | 257/220 |
| 4,866,497 | 9/1989 | Kosonocky | 257/222 |
| 4,888,633 | 12/1989 | Terui | 257/220 |
| 4,901,125 | 2/1990 | Yamada | 257/241 |
| 4,965,648 | 10/1990 | Yang et al. | 257/221 |
| 4,992,841 | 2/1991 | Halvis | 257/221 |
| 5,065,203 | 11/1991 | Yang et al. | 257/221 |
| 5,077,592 | 12/1991 | Janesick | 257/231 |
| 5,155,597 | 10/1992 | Lareau et al. | 348/311 |
| 5,233,429 | 8/1993 | Jung | 257/220 |
| 5,252,509 | 10/1993 | Hosack | 437/203 |
| 5,289,022 | 2/1994 | Iizuka et al. | 257/232 |
| 5,323,034 | 6/1994 | Furumiya | 257/232 |
| 5,369,039 | 11/1994 | Hynecek | 437/53 |
| 5,500,383 | 3/1996 | Hynecek | 437/53 |

OTHER PUBLICATIONS

Chen and Tseng, "A High Speed Tapped CCD Photodiode Linear Image Sensor", IEEE Electron Device Letters, vol. EDL-2, No. 10, Oct. 1981.

*Primary Examiner*—Chandra Chaudhari
*Attorney, Agent, or Firm*—Banner & Witcoff, Ltd.

[57] ABSTRACT

A CCD shift register includes a second gate electrode disposed adjacent to and longitudinally spaced from a first gate electrode, and a buried layer having a first dopant impurity concentration. The first gate electrode is disposed over the buried layer to define a first buried layer area. The second gate electrode is disposed over the buried layer to define a second buried layer area greater than the first buried layer area. In the buried layer, a trench region is formed to have a second dopant impurity concentration greater than the first dopant impurity concentration. The first gate electrode is disposed over the trench region to define a first trench area. The second gate electrode being disposed over the trench region to define a second trench area less than the first trench area. The first and second trench areas are dimensioned so that a first charge storage capacity is equal to or greater than a second charge storage capacity. A tapped CCD shift register includes a first CCD shift register segment and a second shift register segment, both the first and second CCD shift register segments being characterized by a pitch length in the longitudinal direction. The first CCD shift register segment includes a sense node, and the second CCD shift register segment includes a beginning shift register charge storage element, both the sense node and the beginning shift register charge storage element being disposed within one pitch length in the longitudinal direction.

5 Claims, 6 Drawing Sheets

CHANNEL POTENTIAL (V)

TRENCH WITH INCREASED CHARGE STORAGE CAPACITY

LATERAL DIMENSION ACROSS CCD CHANNEL (MICRONS)

FIG. 6

METHOD OF MAKING CCD READOUT REGISTER HAVING MULTIPLE OUTPUTS

This application is a division of U.S. patent application Ser. No. 08/321,267, filed Oct. 11, 1994 now U.S. Pat. No. 5,608,242.

BACKGROUND OF THE INVENTION

1. Field of the Invention

This invention relates to charge coupled devices (CCD) and particularly to CCD readout registers which have multiple output structures for high data rate focal plane applications.

2. Description of Related Art

Two dimensional imaging arrays generally take a snap shot of an image where the whole photoactive array of pixels integrates photogenerated charge for a period of time. At the end of the integration time, the information is transferred from the sensor to an external circuit element using a parallel to serial transfer scheme. Each line of pixel data is transferred into a horizontal CCD shift register. The line of data is then transferred serially to an output device at the end of the register.

Generally the data rate at which signal charge can be transferred is limited by the bandwidth of the output device.

In applications where the data rate must be in excess of the amplifier bandwidth, the horizontal CCD shift register must be partitioned into subregisters. Each subregister or register segment will then transfer signal charge to its own separate output device which operates at the bandwidth limit of the output device. The data is then multiplexed off-chip to reconstruct the image at the higher data rate which is the amplifier bandwidth multiplied by the number of output devices or taps. This register architecture is known as a multi-tapped horizontal readout register.

Tapped register designs require placement of an output device within the horizontal pitch of the register. For high density CCD sensor designs where the pitch is small in view of the minimum dimensions permitted by the design rules for the state of the processing technology used to make the CCD, it is difficult to position an output device within the register pitch such that the output device will have high performance (high conversion efficiency and low noise) while not sacrificing the performance of the horizontal register.

This invention solves the problem of placing a high performance output device within one element of a high density horizontal CCD shift register such that the adjacent shift register elements are not altered in performance. This invention allows for a partial reduction in the area of the first element of a register segment adjacent an output tap without reducing the charge handling capacity of that element.

The invention may be generally applied to any CCD layout which requires that CCD register elements have unequal physical dimensions but which require the same charge handling capacity. In brief, this invention allows for the equilibration of maximum charge handling capacity for CCD well areas of different size. For example, a 10 micron by 10 micron register element can be made to have the same charge handling capacity as a 10 micron by 15 micron register element.

In previous work, this charge handling equilibration would have been achieved making use of stepped oxides under the polysilicon CCD gate electrodes thereby increasing or decreasing the capacitance of the register element. The stepped oxide technique is not very satisfactory since it is difficult to control the process and the electrical parameters of the register element. The stepped oxide technique is not cost effective. This invention improves the state of the art in that it allows for equilibration of charge handling capacity with a simple implant step. This invention uses the concept of a special implant to create a buried channel CCD notch or trench in a register element (see U.S. Pat. No. 4,667,213 granted May 19, 1987 to Kosonocky). The trench is used to increase the charge storage per unit area of a small pitch CCD shift register and to improve the charge transfer efficiency of the register for small signals in cooled devices.

SUMMARY OF THE INVENTION

This invention applies the principle of trench technology to the equilibration of charge handling capacity of CCD register elements of dissimilar size.

In principle and in practice this invention uses the concept of creating a region of increased charge storage density (usually measured in units of number of electrons per unit area) within a CCD register element using an extra implant of a channel doping species (i.e., channel trench implant). The dimension of the channel trench region is designed to compensate for the loss in charge storage capacity (usually measured in units of total number of electrons) of a register element which has been reduced in size from its neighbor. The combination of the regions of differing charge storage densities is designed to equilibrate the total charge storage capacities of two CCD register storage elements which differ in area.

Charge storage capacity can be equilibrated alternatively by changing one of the other independent dimensions of the register storage element such as the gate length (if the channel width is decreased) or the channel width if the gate length is decreased. In some cases the other dimensions are fixed and cannot be altered to equilibrate charge storage capacity. This case arises when inserting an output tap structure into a fixed pitch horizontal shift register. The gate length cannot be increased or decreased due to the fixed pitch of the sensor, but the insertion of the tap structure requires the reduction of channel width. The channel width must be reduced to allow for the placement of metal, contact, and diffusion structures which are minimized in area for minimum parasitic capacitance at the output node or termination of the shift register.

A trench implant is used to increase the charge storage density of a CCD channel by creating a region within the CCD channel which has a heavier doping of n-type species than the surrounding channel doping. Thus the charge handling capacity of the more heavily doped region is increased and the combination charge handling capacities of the normally doped channel plus that of the additionally doped channel yields an increase in the average charge handling capacity which is proportional to the relative areas of normal channel vs trench implanted channel.

In order to insert a tap structure into the CCD register, the area of the first CCD register element of an adjacent register must be reduced, which would normally reduce the charge handling capacity of that register element relative to the adjacent full area register element. The trench implant is then used to increase the area of trench storage area within the narrowed register element such that its average charge storage capacity is equivalent to that of the full sized register element.

In accordance with this invention, the charge handling capacity of all the CCD register elements can be maintained substantially equal, thus maintaining the performance of the sensor, while achieving a low capacitance output tap structure in a high density CCD register structure.

It is an object of the present invention to facilitate a high density area imaging array as measured by the pitch between photoelements. It is a further object of the present invention to facilitate concatenation (i.e., the linking together in a series) of plural subarrays of photoelements into a large area array. It is a further object of the present invention to provide shift registers capable of passing image signals having wide dynamic ranges. It is another object of the present invention to minimize "blooming" effects in photoelement arrays. It is another object of the present invention to equilibrate the charge storage capacity of charge storage elements of a CCD shift register when at least one charge storage element has an area different than the areas of the other charge storage elements. It is another object of the invention to provide an output structure with reduced parasitic capacitance and corresponding high speed operating performance.

These and other objects are achieved with a CCD shift register defining longitudinal and lateral directions which includes a first gate electrode, a second gate electrode disposed adjacent to and longitudinally spaced from the first gate electrode, and a buried layer having a first dopant impurity concentration. The first gate electrode is disposed over the buried layer so as to define a first buried layer area. The second gate electrode is disposed over the buried layer so as to define a second buried layer area greater than the first buried layer area. In the buried layer, a trench region is formed so as to have a second dopant impurity concentration greater than the first dopant impurity concentration. The first gate electrode is disposed over the trench region so as to define a first trench area. The second gate electrode being disposed over the trench region so as to define a second trench area less than the first trench area.

In the CCD shift register, the first buried layer area defines an area for a first charge storage element characterized by a first charge storage capacity, the first charge storage capacity being a function of the first trench area. The second buried layer area defines an area for a second charge storage element characterized by a second charge storage capacity, the second charge storage capacity being a function of the second trench area. The first and second trench areas are dimensioned so that the first charge storage capacity is equal to or greater than the second charge storage capacity.

These and other objects are achieved with a tapped CCD shift register defining longitudinal and lateral directions and including a first CCD shift register segment and a second shift register segment, both the first and second CCD shift register segments being characterized by a pitch length in the longitudinal direction. The first CCD shift register segment includes a sense node, and the second CCD shift register segment includes a beginning shift register charge storage element, both the sense node and the beginning shift register charge storage element being disposed within one pitch length in the longitudinal direction.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The method and apparatus of the invention will be described in the context of a specific exemplary embodiment wherein a floating diffusion tap structure for a charge coupled device (CCD) shift register serves as the signal output mechanism for a 5040×5040 element full frame CCD image sensor. However, it should be understood that the invention may be advantageously employed in any CCD register structure which utilizes a trench implant where layout constraints require both (1) that the physical dimension of at least one register element vary from the physical dimension of the other register elements, and (2) that the performance of the register elements with respect to charge handling capacity be uniformly maintained. For example, a CCD register design which, for the purpose of minimizing capacitance, might be required to be tapered from a wide channel width to a narrow channel width without reducing the charge handling capacity of the register elements would benefit from the use of this invention.

Figure 1:
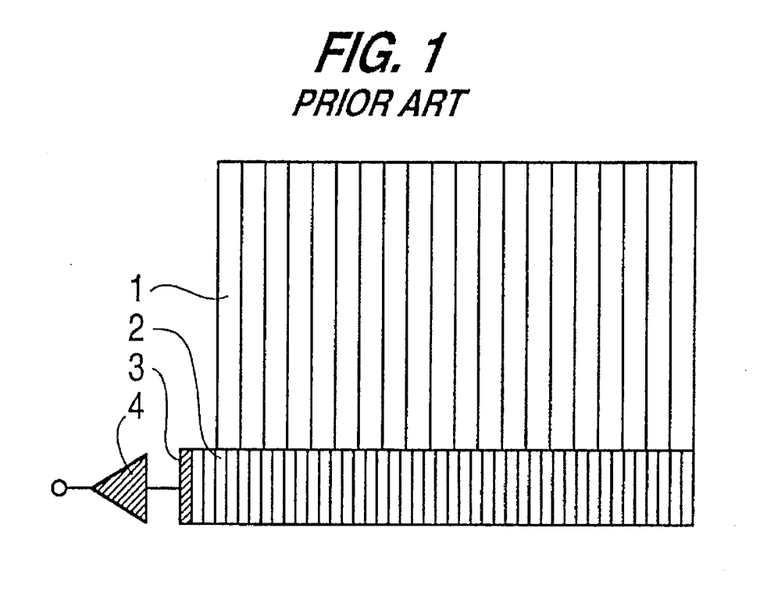
FIG. 1 is a topographical view of a layout of a conventional CCD shift register.

Referring first to FIG. 1, there is shown a conventional CCD image sensor block diagram having imaging area 1, serial or horizontal register area 2, an output node defined by N+ diffusion 3, and analog output signal amplifier 4 which converts photogenerated charge into a voltage signal. Imaging array 1 can be of any of several constructions generally employed in the industry, for example, full frame, frame transfer, interline transfer, time delay and integration, and frame interline transfer architectures. The serial readout register 2 shown is known as a standard, low speed, single output CCD readout register which is commonly employed in the industry. The termination of the serial readout register is shown as an N+ floating diffusion 3 and is commonly employed as a charge sensing node in the CCD image sensor industry. Floating diffusion 3 is used as an input node to a gated charge integrator type amplifier. Output amplifier 4 has numerous configurations but is commonly designed as a one or two stage source follower amplifier.

Figure 2:
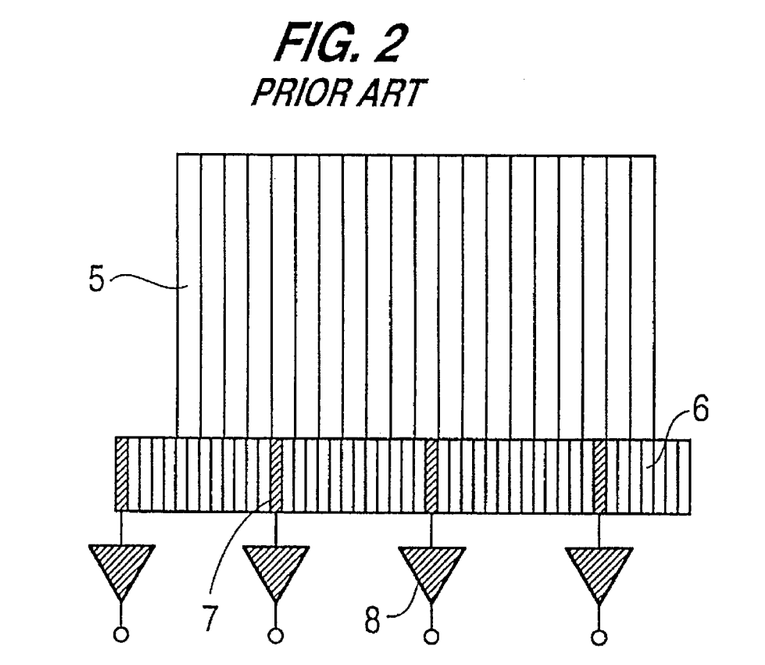
FIG. 2 is a topographical view of a layout of a conventional tapped CCD shift register.

Referring now to FIG. 2, there is shown an imaging array 5 (as in FIG. 1), a tapped serial CCD shift register 6, multiple N+ floating diffusion output nodes or taps 7, and multiple amplifier circuits 8.

In this exemplary embodiment the imaging array is constructed as a full frame transfer buried channel CCD array with 12 micron spacing between photoelements. Metal bus structures for signal lines run along channel stop boundaries between the photoelements. Charges generated in the photoelements are carded to the serial CCD shift register 6 via other CCD shift registers. Serial CCD shift register 6 is clocked with a three phase clock source to drive three polysilicon gate layers. This embodiment incorporates the division of the imaging array into 16 distinct and separately accessible sections, in the horizontal direction, for the purpose of operating each section of the array at different clocking speeds to facilitate compensation of an image motion gradient within a scene. U.S. Pat. No. 5,155,597 granted Oct. 13, 1992 to Lareau, et at. describes an army array of pixels divided into rows and columns where the columns are organized into a plurality of column groups, each column group having its own charge transfer rate corresponding to the image motion rate in that column group.

Figure 3A:
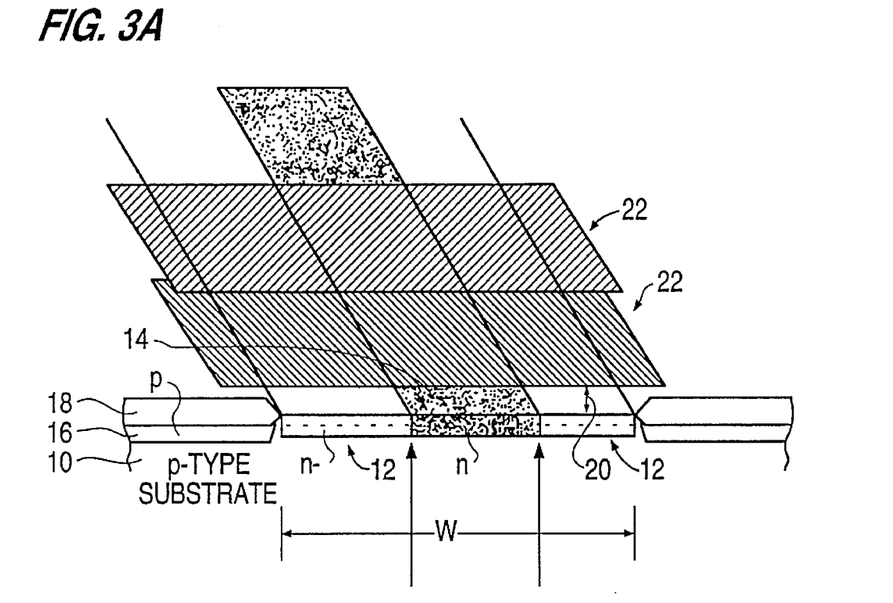
FIG. 3A is a cross sectional view of a CCD shift register according to the present invention.
Figure 3B:
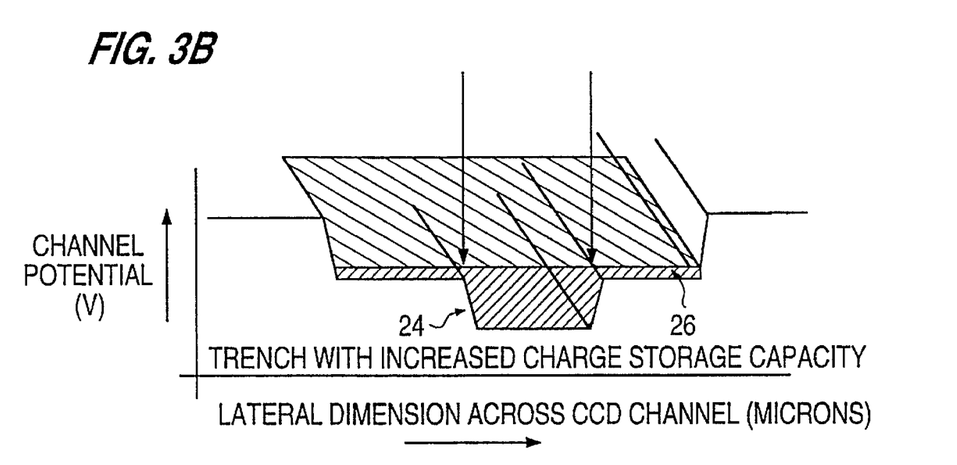
FIG. 3B is a potential well diagram of the cross sectional view of FIG. 3A.

FIGS. 3A and 3B show an abbreviated sectional view, and a corresponding potential well diagram, taken transverse to the longitudinal or principal axis of serial CCD shift register 6. Several structural layers are not shown for simplicity. In FIG. 3A, P type semiconductor substrate 10 is implanted with N type dopant impurities in a channel region of shift register 6 characterized by width W to form N– type buried layer 12. A portion of buried layer 12 is further implanted, or originally implanted to heavier impurity concentrations, with N type dopant impurities to form N type trench region 14. The designation N– and N type dopant impurity indicates known relative impurity concentrations suitable for CCD structures rather than absolute concentrations. Trench region 14 is not necessarily disposed physically at a different depth than buried layer 12; however, in the context of CCD operations, trench region 14 is characterized by a "deeper" potential well 24 (see FIG. 3B) in comparison to the potential well which characterizes buried layer 12 since the concentration of dopant impurities implanted in trench region 14 is greater in comparison to the concentration of dopant impurities implanted in buried layer 12. A region with a deeper potential well can store more signal charges 26 per unit area in comparison to a region with a less deep potential well. Channel stopper regions 16 are preferably formed with P type dopant impurities on lateral sides of the channel. Field oxide 18 and relatively thin gate oxide 20 are formed over the channel and channel stopper regions. These oxide regions may be formed of combinations of silicon dioxide and silicon nitride. CCD gate 22, preferable formed of doped polysilicon, is formed over a gate oxide 20 so as to be oriented to laterally traverse the longitudinal axis of serial CCD shift register 6. It will be appreciated by persons of ordinary skill in the art that there are other semiconductor process which may be used to form the structure shown in FIG. 3A, for example, buried layer 12 may be grown as an epitaxial layer on substrate 10 by thermal decomposition of gases in a low pressure chemical vapor deposition process.

Figure 4:
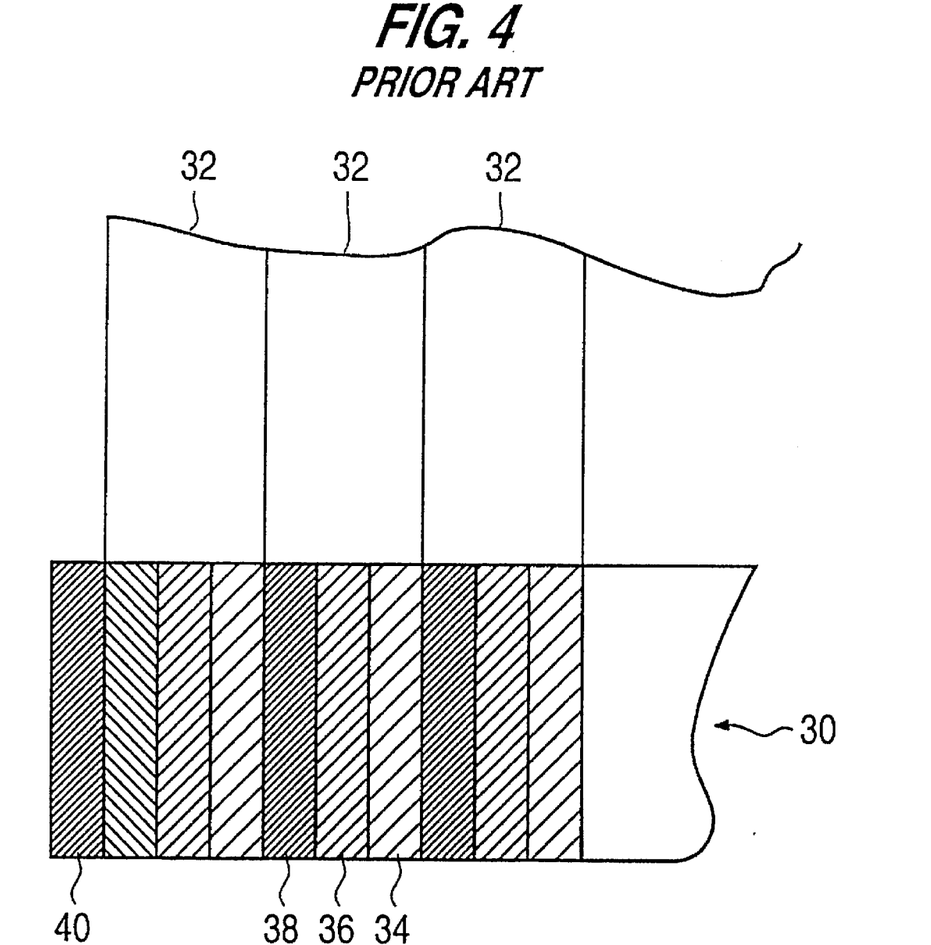
FIG. 4 is a topographical view of a layout of an end section of a conventional tapped CCD shift register with an output node at the end of the active shift register region.

Referring now to FIG. 4, there is shown end section 30 of serial CCD shift register 6. Imaging array sections 32 (shown vertically as depicted in FIG. 4) couple signal charge to end section 30 (shown horizontally as depicted in FIG. 4). At the termination of end section 30 is N+ floating diffusion sense node 40. Three CCD shift register gate electrodes, gates 34, 36 and 38, preferably of doped polysilicon construction, are recurrently disposed to form recurrent storage locations along the length of end section 30. In operation, signal charge is stored in the channel area under one of the gates 34, 36 or 38. Clock signals are applied to the gates to transfer charge "down" the shift register (from right to left as depicted in FIG. 4), for example, in a conventional three phase manner, until the signal charge is transferred to N+ floating diffusion sense node 40. Shift register charge storage elements, which function as capacitors, are defined by the channel area under one of the gates. The charge storage capacity of such a capacitor is defined as:

$$N = C/A \cdot A \cdot V \div q$$

where:
N=number of electrons,
C/A=capacitance per unit area in picofarads per micron squared,
A=area of the capacitor in microns squared,
V=voltage difference in the channel between the storage capacitor gate and the two adjacent gates in volts, and
q=charge of the electron in coulombs.

In FIG. 4, N+ floating diffusion sense node 40 extends beyond the edge of the last imaging array section 32. Since the N+ floating diffusion sense node 40 extends beyond the edge of the last imaging array section 32, a gap is forced between the imaging array sections 32 corresponding to the current serial CCD shift register 6 (i.e., a register segment out of the whole horizontal register) and imaging array sections 32 corresponding to the next serial CCD shift register 6 to be disposed adjacent to the current serial CCD shift register 6 (to the left of the register depicted in FIG. 4).

Figure 5:
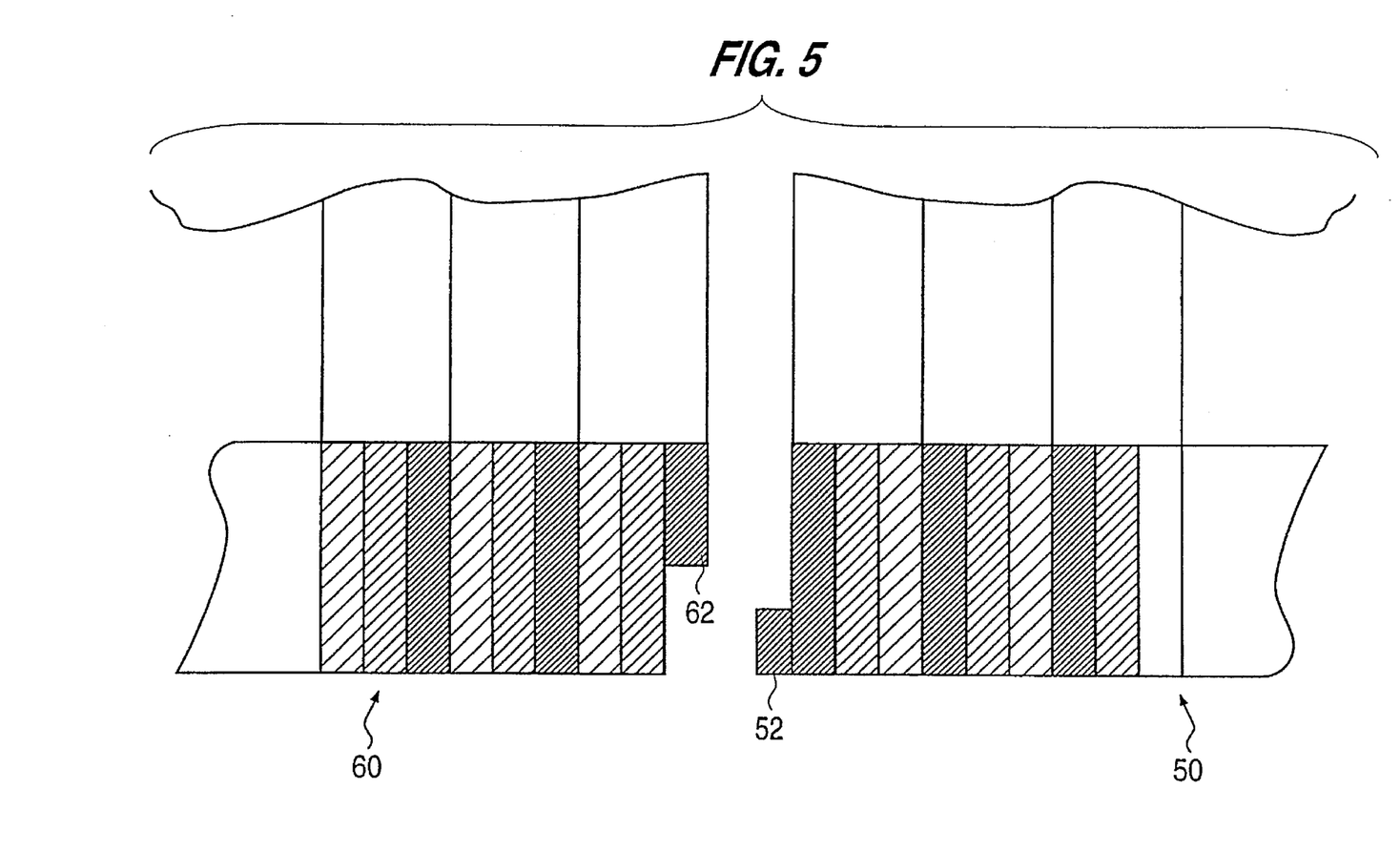
FIG. 5 is a topographical view of a layout of two concatenated CCD shift register segments according to the present invention.

Referring to FIG. 5, there is shown a section of a CCD array, similar to that of FIG. 4, which depicts end section 50 and beginning section 60. End section 50 is a modified version of end section 30. End section 50 differs from end section 30 in that N+ floating diffusion sense node 40 (of FIG. 4) has been reduced to a smaller dimensioned N+ floating diffusion sense node 52. The lateral width (depicted vertically in FIG. 5), across the channel, of node 52 is preferably less than half of the width of the channel. At the same time, the beginning section 60 includes beginning shift register charge storing element 62. Beginning shift register charge storing element 62 is reduced in dimension in comparison to other charge storage elements in the serial CCD shift register. The lateral width (also depicted vertically in FIG. 5), across the channel, of charge storage element 62 is preferably less than half of the width of the channel. This permits end section 50 and beginning section 60 to be disposed adjacent to each other so that imaging array sections 32, corresponding to both end section 50 and beginning section 60, are disposed in a linear array of imaging sections 32 so as to have a uniform pitch by eliminating the gap forced by the layout depicted in FIG. 4.

It will be appreciated by persons skilled in the art that the total channel width available may be partitioned between the lateral width of beginning shift register charge storing element 62 and the lateral width of sense node 52 in such ratio as other design constraints may dictate. For example, the lateral width (depicted vertically in FIG. 5) of sense node 52 may be reduced to minimize parasitic capacitance and maximize output signal bandwidth so that the lateral width (depicted vertically in FIG. 5) of beginning shift register charge storing element 62 may be expanded to fill the rest of the channel width.

The smaller area dimensions of beginning charge storage element 62 creates a reduced area for functioning as a capacitor which would normally result in a reduced capacitance in comparison to the capacitance of other charge storage elements. A reduced capacitance of beginning charge storage element 62 would correspond to a reduced charge storage capacity. The smaller dimensions of beginning charge storage element 62 of the CCD shift register is made necessary in some cases to accommodate insertion of a low capacitance, high performance sense node, such as node 52, and amplifier in a design which contains a very high density pixel pitch; however, it is desirable for beginning charge storage element 62 to maintain the same charge storage capacity as other elements.

Sense node 52 is reduced in area to minimize capacitance so as to facilitate a high speed and a high charge to voltage conversion output structure. The area where the register width is reduced or notched (i.e., element 62) is the location where the closest elements (e.g., contacts and metal buses) of the first stage of the amplifier (e.g., amplifier 8 in FIG. 2) and reset gates would be positioned. In this configuration, first register storage element 62 would ordinarily have a reduced charge storage capacity with respect to adjacent full width register elements. This imbalance in the charge storage capacities of the register elements facilitates an early onset of signal charge spillover or blooming in the register element with the reduced capacity. Thus, the dynamic range performance of the entire image sensor is degraded by the loss of the storage capacity in the one register element. The present invention facilitates the equilibrating of the charge storage capacity of both storage elements regardless of the narrowing of the channel width.

Figure 6:
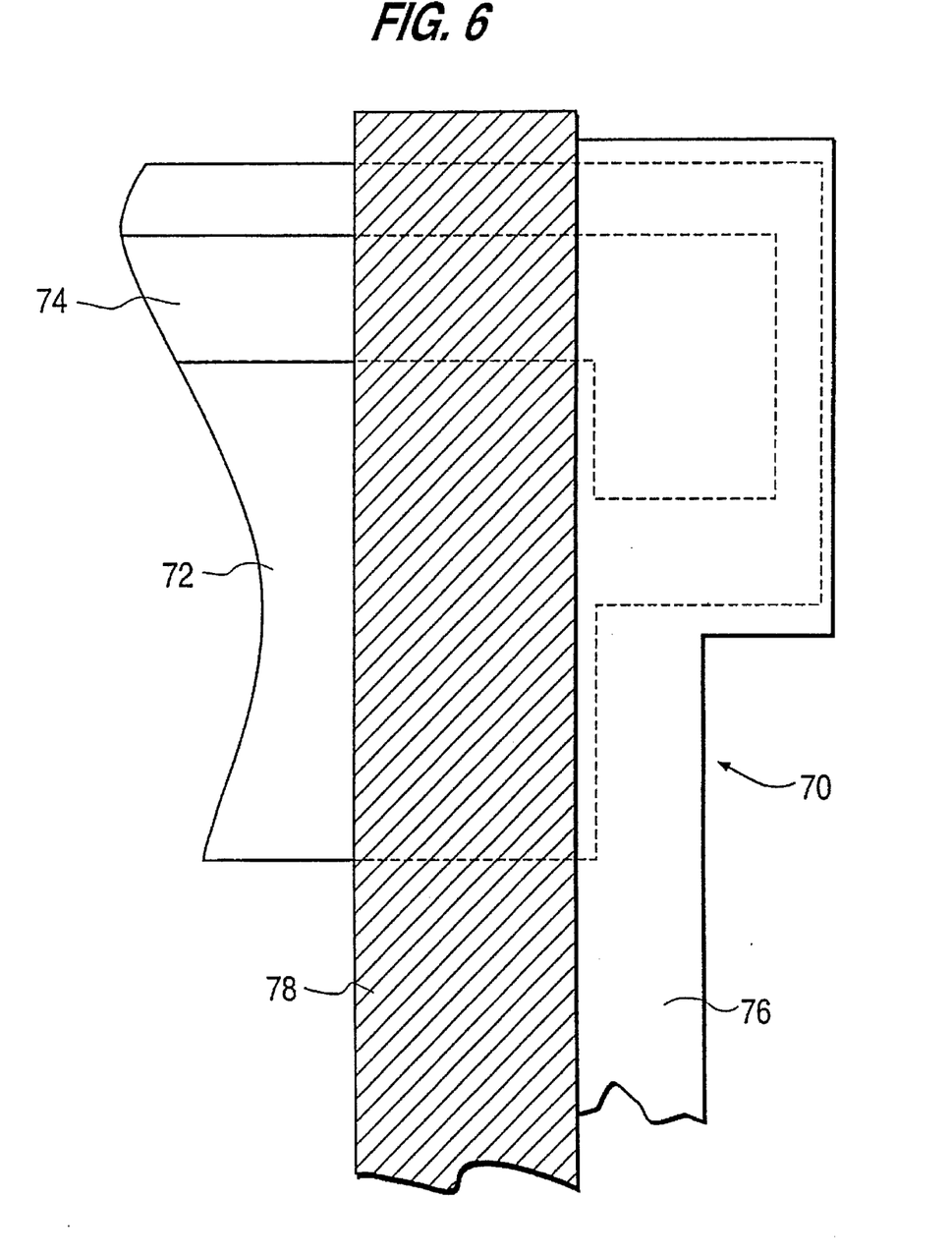
FIG. 6 is an enlarged topographical view of a layout of two adjacent CCD register elements, one with a reduced area, both with a trench implant, the area of the trench implant being increased in the register element with the reduced area according to the present invention.

Referring to FIG. 6, there is shown an enlarged portion 70 of serial CCD shift register 6 (FIG. 2) with two storage elements characterized by different areas. Enlarged portion 70 includes buried layer 72 and trench region 74. Trench region 74 is shown in cross section in FIG. 3. In FIG. 6, first gate 76 overlays buried layer 72 so as to define a first buried layer area, and second gate 78 overlays buried layer 72 so as to define a second buried layer area. The first storage element is characterized by a first charge storage capacity which is a function of the first buried layer area. The second storage element is characterized by a second charge storage capacity which is a function of the second buried layer area.

The charge storage capacity per unit area of a storage element is a function of the dopant impurity concentration in the underlying semiconductor. Trench region 74 is a region of buried layer 72 into which an additional implantation of N type dopant impurities has been applied to create a region of increased charge storage capacity per unit area. The trench pattern has a substantially uniform lateral width through the region of the CCD shift register where the storage elements are dimensioned to have a full lateral width. The trench pattern has an increased lateral width in the region of the CCD shift register where a storage element is dimensioned to have a reduced lateral width. An example of a storage element which has been dimensioned to have a reduced lateral width is beginning register charge storage element 62 (FIG. 5).

The first buried layer area includes (1) the first trench area, and (2) a first difference area, the first difference area being defined as the first buried layer area less the first trench area. A first difference area charge storage capacity for the region over the first difference area is a function of a first dopant impurity concentration characterizing buried layer 72. A first trench area charge storage capacity for the region over the first trench area is a function of a second dopant impurity concentration, greater than the first dopant impurity concentration, characterizing trench region 74. The first difference area charge storage capacity and the first trench area charge storage capacity are combinable to form a first charge storage capacity $(C/A)_1$ characterizing an average charge storage capacity over the first buried layer area $A_1$.

Similarly, the second buried layer area includes (1) the second trench area, and (2) a second difference area, the second difference area being defined as the second buried layer area less the second trench area. A second difference area charge storage capacity for the region over the second difference area is a function of the first dopant impurity concentration characterizing buried layer 72. A second trench area charge storage capacity for the region over the second trench area is a function of the second dopant impurity concentration, greater than the first dopant impurity concentration, characterizing trench region 74. The second difference area charge storage capacity and the second trench area charge storage capacity are combinable to form a second charge storage capacity $(C/A)_2$ characterizing an average charge storage capacity over the second buried layer area $A_2$.

The maximum number of electrons which can be stored by each reduced size register element, characterized by the first buried layer area, is given by:

$$N_1 = (C/A)_1 \cdot A_1 \cdot V \div q, \text{ and}$$

the maximum number of electrons which can be stored by each full size register element, characterized by the second buried layer area, is given by:

$$N_2 = (C/A)_2 \cdot A_2 \cdot V \div q,$$

thus, it becomes clear how to adjust the first and second trench areas so that $N_2 = N_1$ to equilibrate the charge handling capacity of CCD register elements of dissimilar size.

It will be appreciated by persons skilled in the art that the geometric pattern of the trench region, or for that matter of the buried layer, is not restricted to rectangular patterns as depicted in FIG. 6. For example, the trench region might be in the form of a laterally expanding taper, or the buried layer might be in a tapered form and the trench region in the form of a counter taper, or in the form of a series of laterally extending stubs where the stub extension length corresponds to the narrowing width of the tapering buried layer.

Figure 7:
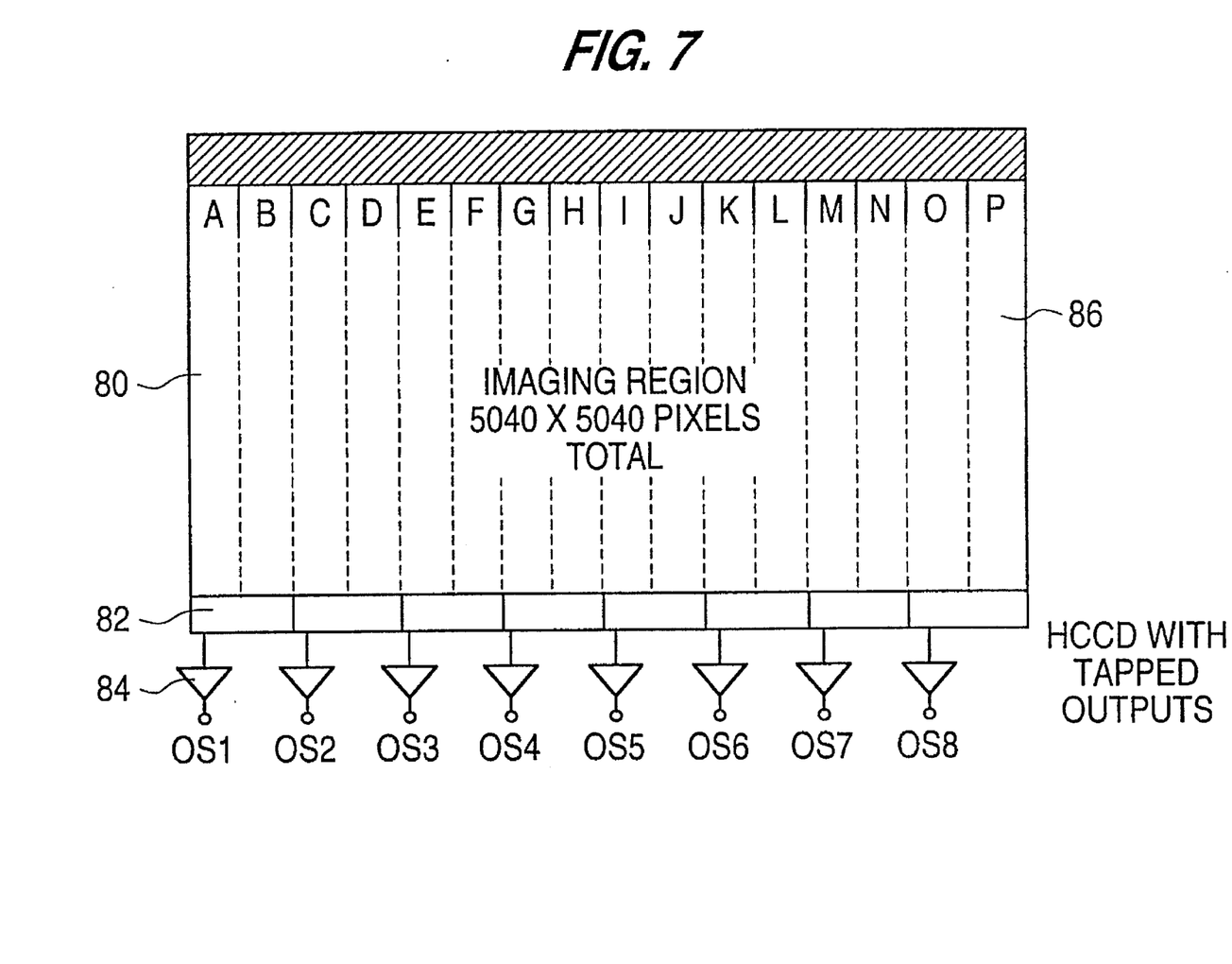
FIG. 7 is a block diagram of an exemplary embodiment of the invention.

In FIG. 7, an exemplary embodiment of the invention has been applied to a full frame CCD image sensor 80 comprising 5040×5040 photoelements, a horizontal register 82, the photoelements and horizontal register having a pitch of 12 microns, 8 separate output taps 84 being equally spaced on the horizontal shift register, 16 sections of vertical clocks 86, three polysilicon gates, buried channel processing, metal bus straps for signals running vertically along channel isolations between pixels, and a second layer of metal serving as a light shield over the non-imaging sections of the image sensor.

Evaluation of this exemplary embodiment of the invention has confirmed that the reduction in capacitance afforded by the minimization of geometries in the tap region (e.g., N+ floating diffusion sense node 52), which, in turn, is possible due to the reduction in area of the first register element (e.g., beginning shift register charge storage element 62) of the adjacent readout register section, improves the sensitivity of the output structure by a factor of 2 over the output structure construction which characterizes the prior art. The reduction in area of the first stage of the register adjacent to the output tap is, in turn, accomplished without reducing the saturation charge capacity of that register element by the proper enlargement of the channel trench implant in that register element. The efficacy of the invention has been demonstrated. The saturation capacity of the notched register element is equal to or greater than the saturation capacity of the neighboring, full sized, register element.

Having described preferred embodiments of a novel CCD readout register having multiple outputs (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. A method of fabricating a tapped CCD shift register, the tapped CCD shift register defining a longitudinal direction and including first and second CCD shift register segments, the first and second CCD shift register segments being characterized by a pitch length in the longitudinal direction, the method comprising steps of:

forming a sense node adjacent to a terminal storage element of the first CCD shift register segment, the sense node being disposed between the first and second CCD shift register segments; and forming a first storage element in an initial end of the second CCD shift register segment, the first storage element and the sense node being disposed within one pitch length in the longitudinal direction.

2. The method of claim 1, further comprising a step of forming a second storage element adjacent to the first storage element in the second CCD shift register segment so that the first storage element is capable of storing the same signal charge as the second storage element, the second storage element being spaced from the first CCD shift register segment by one pitch length in the longitudinal direction, the first storage element and the sense node being disposed between the second storage element and the first CCD shift register segment.

3. The method of claim 2, wherein:

the steps of forming a first storage element and forming a second storage element includes a step of forming a buried layer, the buried layer having a first dopant impurity concentration;

the steps of forming a first storage element and forming a second storage element further includes a step of forming a trench region, the trench region having a second dopant impurity concentration, the second dopant impurity concentration being greater than the first dopant impurity concentration; and the step of forming a trench region includes steps of forming a first trench region characterized by a first trench area in the first storage element and forming a second trench region characterized by a second trench area in the second storage element, the first trench area being larger than the second trench area.

4. A method of fabricating a CCD shift register, the CCD shift register defining a longitudinal direction, the CCD shift register being characterized by a pitch length in the longitudinal direction, the method comprising steps of:

forming a first storage element in the CCD shift register, the first storage element being characterized by a first storage area and an extent in the longitudinal direction of one pitch length; and forming a second storage element in the CCD shift register so that the first storage element is capable of storing the same signal charge as the second storage element, the second storage element being characterized by a second storage area and an extent in the longitudinal direction of one pitch length, the second storage area being greater than the first storage area.

5. The method of claim 4, wherein:

the steps of forming a first storage element and forming a second storage element includes a step of forming a buried layer, the buried layer having a first dopant impurity concentration;

the steps of forming a first storage element and forming a second storage element further includes a step of forming a trench region, the trench region having a second dopant impurity concentration, the second dopant impurity concentration being greater than the first dopant impurity concentration; and the step of forming a trench region includes steps of forming a first trench region characterized by a first trench area in the first storage element and forming a second trench region characterized by a second trench area in the second storage element, the first trench area being larger than the second trench area.

* * * * *